United States Patent
Amaki et al.

(10) Patent No.: US 9,785,383 B2
(45) Date of Patent: Oct. 10, 2017

(54) MEMORY SYSTEM AND METHOD OF CONTROLLING NONVOLATILE MEMORY

(71) Applicant: Toshiba Memory Corporation, Minato-ku (JP)

(72) Inventors: Takehiko Amaki, Yokohama (JP); Riki Suzuki, Yokohama (JP); Toshikatsu Hida, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/840,339

(22) Filed: Aug. 31, 2015

(65) Prior Publication Data
US 2016/0266970 A1 Sep. 15, 2016

Related U.S. Application Data

(60) Provisional application No. 62/130,291, filed on Mar. 9, 2015.

(51) Int. Cl.
| | |
|---|---|
| G06F 11/10 | (2006.01) |
| G06F 3/06 | (2006.01) |
| G11C 16/26 | (2006.01) |
| G11C 16/08 | (2006.01) |
| G11C 11/56 | (2006.01) |
| G11C 13/00 | (2006.01) |
| G11C 29/02 | (2006.01) |

(Continued)

(52) U.S. Cl.
CPC ............ G06F 3/0679 (2013.01); G06F 3/064 (2013.01); G06F 3/0619 (2013.01); G06F 11/1048 (2013.01); G11C 11/5642 (2013.01); G11C 13/004 (2013.01); G11C 16/08 (2013.01); G11C 16/26 (2013.01); G11C 29/021 (2013.01); G11C 29/028 (2013.01); G11C 29/42 (2013.01); G11C 29/52 (2013.01); G11C 2013/0057 (2013.01); G11C 2029/0411 (2013.01); G11C 2211/5644 (2013.01)

(58) Field of Classification Search
CPC ....................................................... G06F 11/10
USPC ..................... 714/801, 704, 37, 33, 25, 38.1
See application file for complete search history.

(56) References Cited

U.S. PATENT DOCUMENTS

| | | | |
|---|---|---|---|
| 7,558,120 | B2 | 7/2009 | Takai |
| 7,900,125 | B1 | 3/2011 | Liu et al. |

(Continued)

FOREIGN PATENT DOCUMENTS

| | | |
|---|---|---|
| JP | 2003-150459 | 5/2003 |
| JP | 2013-25821 | 2/2013 |
| JP | 2014-86128 | 5/2014 |

*Primary Examiner* — Fritz Alphonse
(74) *Attorney, Agent, or Firm* — Oblon, McClelland, Maier & Neustadt, L.L.P.

(57) ABSTRACT

According to one embodiment, a memory controller of a memory system includes a command issuing unit, a decoder, a counter, and a statistical processor. The command issuing unit issues a first command for single read of first data from a nonvolatile memory. The decoder performs first error correction on the read first data. The counter counts a number of times of multiple reads. The statistical processor performs statistical processing of results of the multiple reads, and outputs second data obtained by the statistical processing. When the decoder is unable to perform the first error correction on the read first data, the command issuing unit issues a second command for multiple reads of the first data.

20 Claims, 12 Drawing Sheets

(51) Int. Cl.
*G11C 29/42* (2006.01)
*G11C 29/52* (2006.01)
*G11C 29/04* (2006.01)

(56) References Cited

U.S. PATENT DOCUMENTS

| | | |
|---|---|---|
| 8,380,915 B2 | 2/2013 | Wood et al. |
| 8,631,310 B2 | 1/2014 | Yang |
| 2008/0004841 A1* | 1/2008 | Nakamura ............ G06F 11/008 702/186 |
| 2008/0244319 A1* | 10/2008 | Nehab ................. G06F 11/0709 714/38.1 |
| 2013/0227231 A1* | 8/2013 | Sokolov .............. G06F 11/1072 711/154 |
| 2014/0119124 A1 | 5/2014 | Kim et al. |

* cited by examiner

| PROCESS NAME | Vth TRACKING | ECC |
|---|---|---|
| DEFAULT READ PROCESS | NO TRACKING (OR HISTORY VALUE STORED IN PREVIOUS TRACKING) | WEAK ECC |
| FIRST RETRY READ PROCESS | COARSE TRACKING | WEAK ECC |
| SECOND RETRY READ PROCESS | COARSE TRACKING (HISTORY VALUE STORED IN FIRST RETRY READ PROCESS) | STRONG ECC |
| THIRD RETRY READ PROCESS | FINE TRACKING | STRONG ECC |

MEMORY SYSTEM AND METHOD OF CONTROLLING NONVOLATILE MEMORY

CROSS-REFERENCE TO RELATED APPLICATIONS

This application is based upon and claims the benefit of priority from U.S. Provisional Application No. 62/130,291, filed on Mar. 9, 2015; the entire contents of which are incorporated herein by reference.

FIELD

Embodiments described herein relate generally to a memory system and a method of controlling nonvolatile memory.

BACKGROUND

A solid state drive (SSD) using a NAND type flash memory as a storage medium has been used. The life of the SSD, as an important performance index, heavily depends on a bit error rate of a memory. Therefore, reduction of the bit error rate has been required.

DETAILED DESCRIPTION

In general, according to one embodiment, a memory system which includes a nonvolatile memory, and a memory controller is provided. The nonvolatile memory has a memory cell storing two or more bit data. The memory controller receives a read request from a host, and performs processing according to the read request. The memory controller includes a command issuing unit, a decoder, a counter, and a statistical processor. The command issuing unit issues a first command for single read of first data from the nonvolatile memory. The decoder performs first error correction on the read first data. The counter counts a number of times of multiple reads. The statistical processor performs statistical processing of results of the multiple reads, and outputs second data obtained by the statistical processing. When the decoder is unable to perform the first error correction on the read first data, the command issuing unit issues a second command for multiple reads of the first data.

The memory system and a method of controlling a nonvolatile memory according to embodiments will be described below in detail with reference to the accompanying drawings. It should be noted that the present invention is not limited to these embodiments. Further, description will be made below of generation of a bit error rate in the nonvolatile memory, and then, an embodiment for reduction of the bit error rate.

A memory cell of a NAND type flash memory (hereinafter, referred to as NAND memory) stores a plurality of states. Each of the states corresponds to bit information of the memory cell. An example of a 2-bit/cell NAND memory will now be described below.

Figure 1:
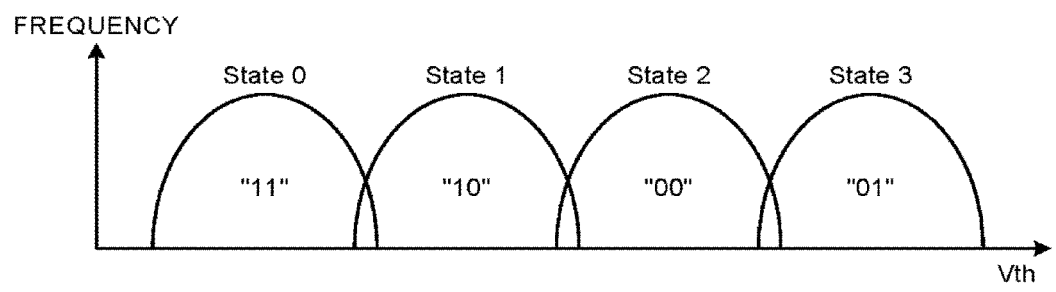
FIG. 1 is a graph illustrating an exemplary threshold distribution in a 2-bit/cell.

FIG. 1 is a graph illustrating an exemplary threshold distribution in a 2-bit/cell. In FIG. 1, a horizontal axis represents threshold voltage Vth, and a vertical axis represents frequency. A 2-bit/cell can have the number of states expressed by the following formula: $N=4(=2^2)$, wherein N is the possible number of states of the memory cell. The memory cell has threshold voltages forming distribution having four peaks according to written bit information. The peaks correspond to bit information "11", "10", "00", and "01", respectively, in ascending order of threshold voltage. Further, when the threshold voltage of the memory cell is within each range of the peaks, it means that the threshold is in each of a state 0, a state 1, a state 2, and a state 3.

Figure 2:
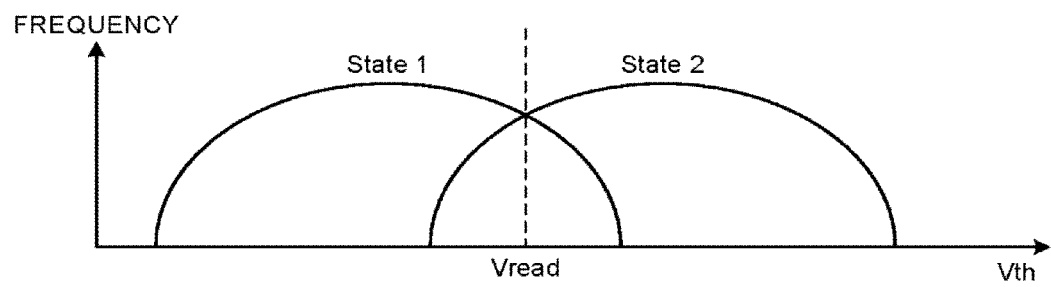
FIG. 2 is a schematic graph illustrating an exemplary relationship between a threshold distribution and a read voltage.

FIG. 2 is a schematic graph illustrating an exemplary relationship between a threshold distribution and a read voltage. In FIG. 2, the states 1 and 2 are extracted from FIG. 1 and enlarged. As illustrated in FIGS. 1 and 2, adjacent peaks in threshold voltage are partially overlapped. Here, the read voltage Vread for distinction between the states 1 and 2 is set to minimum the total of a probability that the memory cell written to have the state 1 is read as the memory cell having the state 2, and a probability that the memory cell written to have the state 2 is read as the memory cell having the state 1.

Figure 3A:
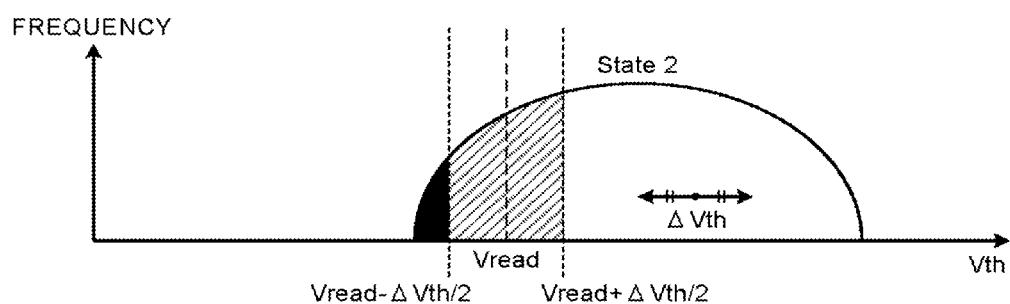
FIG. 3A is a graph illustrating a range of a threshold voltage in which bit error occurs upon performance of only one read operation.
Figure 3B:
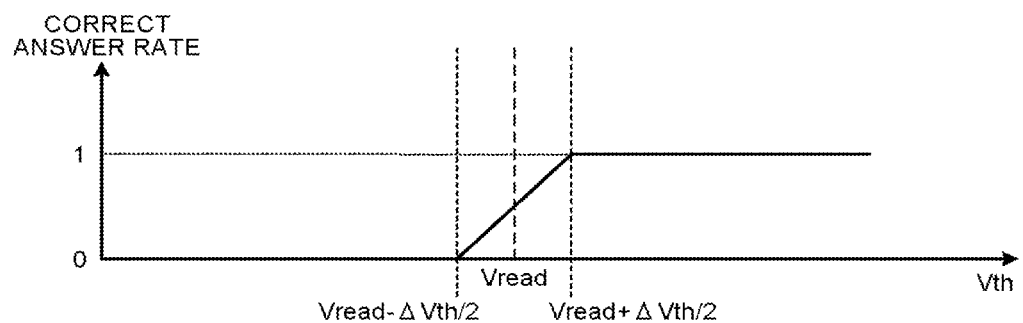
FIG. 3B is a graph illustrating a probability of a correct read result obtained upon performance of the only one read operation.

FIG. 3A is a graph illustrating a range of a threshold voltage in which bit error occurs upon performance of only one read operation, and FIG. 3B is a graph illustrating a probability of a correct read result obtained upon performance of the only one read operation. This example shows the memory cell into which the bit information "00" is written. When the state 2 is expected to be read as a read value, the state 1 is read and a wrong read value is provided. In that case, the threshold voltages of the memory cells upon reading are distributed as illustrated in FIG. 3A. Further, the threshold voltages are temporally dispersed, and the threshold voltages fluctuate within the range of $\pm\Delta Vth/2$. Here, the temporal dispersion of the threshold voltages are assumed to be uniformly distributed within the range of an average$\pm\Delta Vth/2$, for convenience.

At this time, as illustrated in FIG. 3A, a memory cell having a threshold voltage Vth expressed by Vth<(Vread−$\Delta Vth/2$) always provides the wrong read value. Further, a memory cell having a threshold voltage Vth expressed by (Vread−$\Delta Vth/2$)≤Vth<(Vread+$\Delta Vth/2$) may provide the wrong read value. Still further, a memory cell having a threshold voltage Vth expressed by (Vread+$\Delta Vth/2$)≤Vth does not provide the wrong read value. FIG. 3B illustrates a relationship between the threshold voltage and the probability of obtaining a correct read value, which has been described above. When uniform distribution is assumed, the expression (Vread−$\Delta Vth/2$)≤Vth≤(Vread+$\Delta Vth/2$) shows a linearly rising correct answer rate. The above description can be applied similarly to a combination of two different states.

As described above, performance of only one read operation provides the wrong read value, or may provide the wrong read value. Therefore, in the following embodiments, a memory system reducing a probability of providing the wrong read value and a possible probability of providing the wrong read value, and a method of controlling a nonvolatile storage memory device.

First Embodiment

Figure 4:
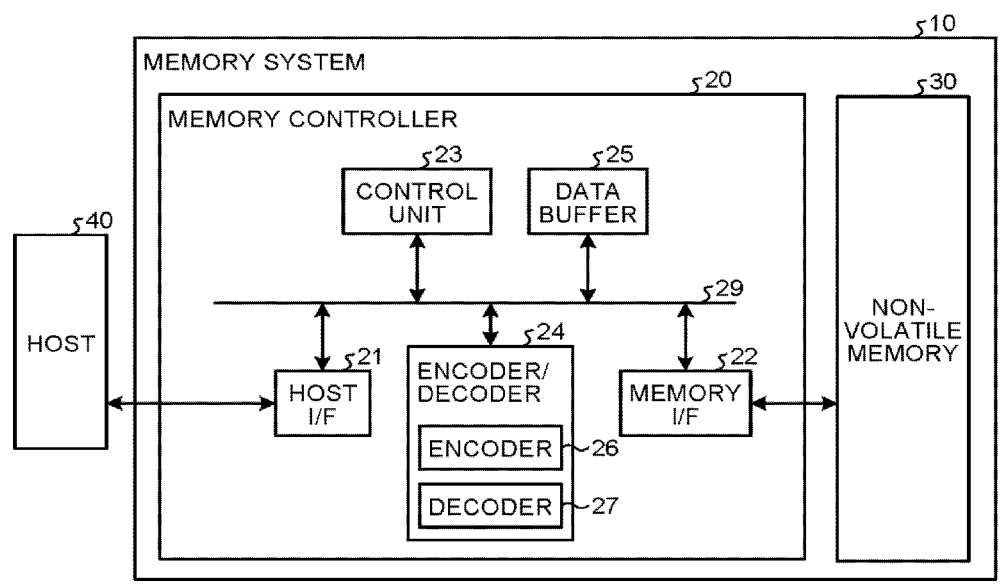
FIG. 4 is a schematic block diagram illustrating an example of a memory system according to a first embodiment.

FIG. 4 is a schematic block diagram illustrating an example of a memory system according to a first embodiment. The memory system 10 includes the memory controller 20, and the nonvolatile memory 30. The memory system 10 is allowed to be connected with the host 40, and FIG. 4 illustrates the memory system 10 being connected with the host 40. The host 40 is, for example, an electronic device such as a personal computer or a mobile terminal.

The nonvolatile memory 30 is a memory for storing data in a nonvolatile manner, for example, a NAND memory. The nonvolatile memory 30 may be a planar NAND memory or a three-dimensional NAND memory. In addition, the nonvolatile memory 30 may be a resistive random access memory (ReRAM), ferroelectric random access memory (FeRAM), or the like.

The memory system 10 may be a memory card, a solid state drive (SSD), or the like including the memory controller 20 and the nonvolatile memory 30 in one package.

The memory controller 20 controls writing to the nonvolatile memory 30 according to a write command (request) from the host 40. Further, reading from the nonvolatile memory 30 is controlled according to a read command from the host 40. The memory controller 20 includes a host I/F (host interface) 21, a memory I/F (memory interface) 22, a control unit 23, an encoder/decoder 24, and a data buffer 25. The host I/F 21, the memory I/F 22, the control unit 23, the encoder/decoder 24, and the data buffer 25 are connected through an internal bus 29.

The host I/F 21 performs processing according to an interface standard between the host I/F 21 and the host 40, and outputs commands, user data, or the like received from the host 40 to the internal bus 29. The host I/F 21 transmits user data read from the nonvolatile memory 30, response from the control unit 23, or the like to the host 40. It is noted that, in the present embodiment, data written to the nonvolatile memory 30 according to a write request from the host 40 is referred to as the user data.

The memory I/F 22 performs a write process to the nonvolatile memory 30 based on an instruction from the control unit 23. Further, the memory I/F 22 performs a read process from the nonvolatile memory 30 based on an instruction from the control unit 23.

The control unit 23 is a control unit for generally controlling each component element of the memory system 10. The control unit 23 performs control according to a command received from the host 40 through the host I/F 21. For example, the control unit 23 instructs the memory I/F 22 to write the user data and parity to the nonvolatile memory 30, according to the command from the host 40. In addition, the control unit 23 instructs the memory I/F 22 to read the user data and parity from the nonvolatile memory 30, according to the command from the host 40.

Further, when the control unit 23 receives the write request from the host 40, the control unit 23 determines a storage area (memory area) in the nonvolatile memory 30 for the user data accumulated in the data buffer 25. That is, the control unit 23 manages a write destination to determine the write destination of the user data. Logical addresses of the user data received from the host 40, and physical addresses representing the storage areas of the nonvolatile memory 30 storing the user data correspond to one another, and the correspondence is stored as an address translation table.

Further, when the control unit 23 receives the read request from the host 40, the control unit 23 converts a logical address specified by the read request to a physical address using the address translation table, and instructs the memory I/F 22 to read data from the physical address.

In the first embodiment, the control unit 23 is configured so that a plurality of read processes having different error correction capabilities are prepared against failure in default reading data from the nonvolatile memory 30, and the read processes are performed sequentially from a read process having a lower error correction capability. In each read process, a single read process is performed at first, and when the read process results in failure, a multiple read process is performed. The read result is determined through the statistical processing based on the results of the multiple read process. This process will be described later.

The data buffer 25 temporarily stores the user data received from the host 40 by the memory controller 20, before the user data is stored in the nonvolatile memory 30. The data buffer 25 temporarily stores the user data read from the nonvolatile memory 30, before the user data is transmitted to the host 40. The data buffer 25 includes, for example, a general-purpose memory such as a static random access memory (SRAM) or a dynamic random access memory (DRAM).

The user data transmitted from the host 40 is transferred to the internal bus 29, and stored in the data buffer 25. The encoder/decoder 24 encodes the data stored in the nonvolatile memory 30, and generates a code word. The encoder/decoder 24 includes an encoder 26 and the decoder 27. The encoder 26 generates an error correction code such as a Bose-Chaudhurl-Hocquenghem (BCH) code for data to be stored. In the first embodiment, the encoder generates a plurality of error correction codes having different correction capabilities for data to be stored. The decoder 27 detects an error of data read using the error correction code, and corrects the error.

Figure 5:
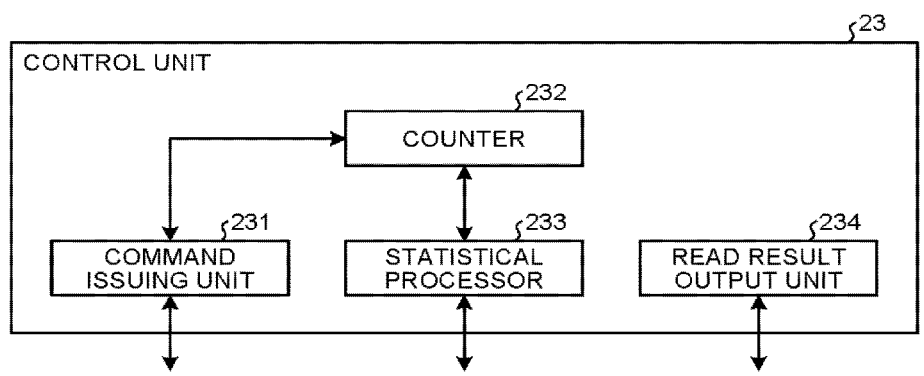
FIG. 5 is a schematic block diagram illustrating an exemplary functional configuration of a control unit according to the first embodiment.

FIG. 5 is a schematic block diagram illustrating an exemplary functional configuration of a control unit according to the first embodiment. The control unit 23 includes the command issuing unit 231, the counter 232, the statistical processor 233, and a read result output unit 234. It is noted that an object of the first embodiment is to reduce the bit error rate upon reading, and description will be made of only a processing unit relating to the read process.

When the command issuing unit 231 receives the read request from the host 40 through the host I/F 21, the command issuing unit 231 issues a command for performing the read process of reading target data from the nonvolatile memory 30 to the nonvolatile memory 30 through the memory I/F 22. In the first embodiment, a default read process is performed upon the read request. Then, according to a reading condition, a first retry read process, a second retry read process, and a third retry read process may be sequentially performed.

Figures 6, 7:
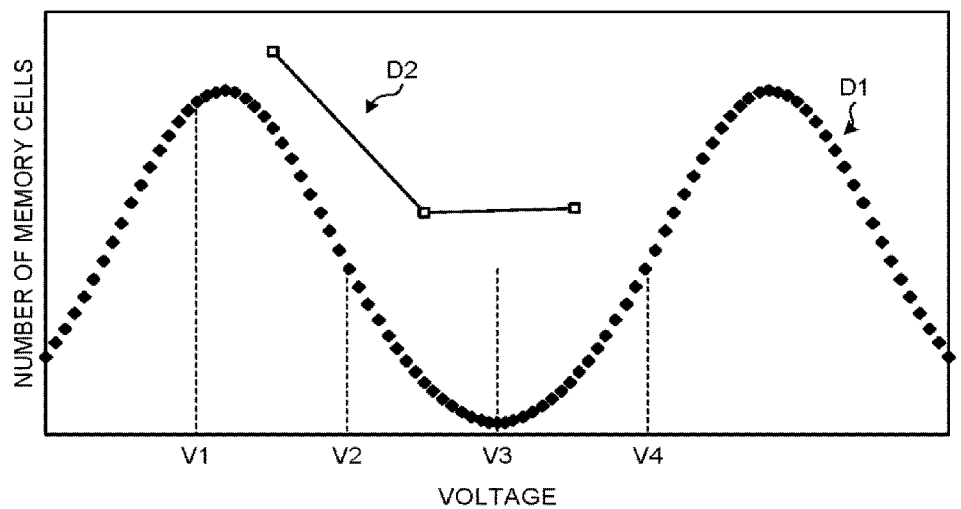
FIG. 6 is a table illustrating exemplary contents of a read process performed by a memory I/F, a control unit, and an encoder/decoder according to the first embodiment.
FIG. 7 is a schematic graph illustrating Vth tracking process.

FIG. 6 is a table illustrating exemplary contents of a read process performed by a memory I/F, a control unit, and an encoder/decoder according to the first embodiment. Each read process is defined by a combination of a content of Vth tracking and a strength level of the error correction. The Vth tracking is a process of monitoring a threshold voltage distribution of the memory cells, predicting the bottom of the distribution, and obtaining a read voltage, for searching for an optimal value in a read level.

Here, an overview of the Vth tracking will be described. First, a voltage range is divided into a certain number of parts, and each memory cell is read using a read voltage corresponding to each part of the voltage range. Next, the number of bits having a voltage equal to or less than the read voltage is counted. Then, the number of bits is counted using an adjacent read voltage, and a difference between them are calculated. Thus calculated values are plotted in the order of read voltages, and a Vth distribution can be obtained. A point having a minimum difference in number of bits with respect to an adjacent read voltage is determined as a bottom of the Vth distribution.

FIG. 7 is a schematic graph illustrating Vth tracking process. In FIG. 7, a horizontal axis shows voltage (read voltage for memory cell or threshold voltage of memory cell), and a vertical axis shows the number of memory cells. Fine Vth tracking process described below provides a Vth distribution obtained by using, for example, 120 read voltages. For example, the fine Vth tracking process is expressed by a dot distribution D1 plotted using a black square in FIG. 7. The distribution D1 represents a threshold voltage distribution, for example, obtained by changing the read voltage to have an achievable minimum voltage width in the memory system. The fine Vth tracking process searches for all bottoms.

Further, coarse Vth tracking process described below provides a Vth distribution for example using four read voltages. For example, the coarse Vth tracking process is expressed by a dot distribution D2 plotted using a white square in FIG. 7. The distribution D2 represents a threshold voltage distribution obtained by changing the read voltage to have a voltage width larger than the minimum voltage width. Specifically, a leftmost white square shows a difference between the number of bits having a voltage equal to or less than a read voltage V2, and the number of bits having a voltage equal to or less than a read voltage V1 on the vertical axis, and an intermediate value between the read voltage V1 and the read voltage V2 on the horizontal axis. The second leftmost white square shows a difference between the number of bits having a voltage equal to or less than a read voltage V3, and the number of bits having a voltage equal to or less than a read voltage V2 on the vertical axis, and an intermediate value between the read voltage V2 and the read voltage V3 on the horizontal axis, the third leftmost white square shows a difference between the number of bits having a voltage equal to or less than a read voltage V4, and the number of bits having a voltage equal to or less than a read voltage V3 on the vertical axis, and an intermediate value between the read voltage V3 and the read voltage V4 on the horizontal axis. It is noted that, in the coarse Vth tracking process, only one bottom is searched for by the above-mentioned method, and the positions of the other bottoms are estimated based on the position of the one bottom having been searched for. For example, a Vth distribution of a 3 bit/cell has eight peaks, and the number of bottoms is seven. In the coarse Vth tracking, only one of the positions of the bottoms is obtained by the above-mentioned search, and the other six bottoms are obtained by estimation based on the obtained position of the one bottom.

As described above, the fine Vth tracking process has a read voltage having a smaller interval (voltage points to be read are increased in number) compared with the coarse Vth tracking process, and a value closer to a true Vth distribution is obtained. It is noted that, as voltage points to be read are increased in number, a time required for searching for the bottom of the Vth distribution is increased, and as the voltage points to be read are reduced in number, the time required for searching for the bottom of the Vth distribution is reduced.

In the default read process, a memory cell read process is performed without performing the Vth tracking, and a result of the memory cell read process is corrected by a weak ECC. The correction by the weak ECC means correction of an error in the read result by the decoder 27, using an ECC having a low error correction capability. In the first retry read process, the coarse Vth tracking is performed to obtain resultant coarse read voltages, the memory cell read process is performed using the resultant coarse read voltages, and a result of the memory cell read process is corrected using the weak ECC. In the second retry read process, the memory cell read process is performed using the coarse read voltages obtained by the coarse Vth tracking, and a result of the memory cell read process is corrected using a strong ECC. The correction using the strong ECC means correction of an error in the read result by the decoder 27, using ECC having a high error correction capability. It is noted that strength of the ECC represents a relative level of the error correction capability. That is, the strong ECC has an error correction capability higher in level than that of the weak ECC, and can correct more bit errors. In the third retry read process, the fine Vth tracking is performed to obtain resultant fine read voltages, the memory cell read process is performed using the resultant fine read voltages, and a result of the memory cell read process is corrected by the strong ECC. In at least one of the default read process and the first to third retry read processes, the multiple read process is performed. The fine Vth tracking has a read voltage having a smaller interval compared with the coarse Vth tracking, and is performed on condition that the number of reading is increased to search one bottom.

The first retry read process is performed upon failure in reading in the default read process. The second read process is performed upon failure in reading in the first retry read process. The third read process is performed upon failure in reading in the second retry read process.

The processes as described above are performed in the first embodiment. Therefore, the command issuing unit 231 issues a single read command, a coarse Vth tracking-performing command, a fine Vth tracking-performing command, and a multiple read command. It is noted that, in this example, the Vth tracking process performed with the support of commands for performing whole Vth tracking process will be exemplified, but appropriate read voltages may be searched for by repetitively issuing commands while sweeping the read voltage and processing the results.

When the command issuing unit 231 issues the multiple read command, the counter 232 counts a number of repetition of reading. The number of repetition of reading is set to a certain number. For example, the multiple read command has the number of repetition of reading set to "M (M is an integer equal to or greater than 2)".

The statistical processor 233 statistically processes the read values from the nonvolatile memory 30, and determines the read result based on a statistic. In the first embodiment, the statistical processor 233 determines, as the read value, the bit information associated with an integral value close to an average of the states of the memory cell associated with the bit information obtained as the results of the multiple read. Therefore, the statistical processor 233 has a storage unit for holding an accumulated read value. Specifically, the statistical processor 233 obtains a state n by the read process, and accumulates and stores the obtained value n (n is an integer equal to or greater than 0 and equal to or less than N). After the end of a certain number M of times of reading, the accumulated value is divided by the certain number. Then a state having a value n' closest to the quotient is employed, and the bit information associated with the employed state n' is output as the read value.

The read result output unit 234 performs processing based on a result of error correction of the read value at the decoder 27. Specifically, upon error correction of the read value at the decoder 27, the read result is output, as success in reading, to the host 40 through the host I/F 21. Upon non-correction of the read value at the decoder 27, or upon failure in reading, the processing is performed according to a current step of the read process. For example, upon failure in reading in the default read process, the first retry read process, or the second retry read process of FIG. 6, the command issuing unit 231 is instructed to change the process to a next read process. While, upon failure in reading in the third retry read process, a failure response to the read request is returned to the host 40 through the host I/F 21. It is noted that the read value to be corrected by the decoder 27 is any of the read value read from the nonvolatile memory 30 by the single read, and the read value output from the statistical processor 233 after a plurality of read values are statistically processed.

Further, when the read value is read by the single read in any of the default read process, the first retry read process, the second retry read process, and the third retry read process, and cannot be corrected by the decoder 27, the read result output unit 234 instructs the command issuing unit 231 to perform the multiple read process.

It is noted that the command issuing unit 231, the statistical processor 233, and the read result output unit 234 include software.

Figure 8:
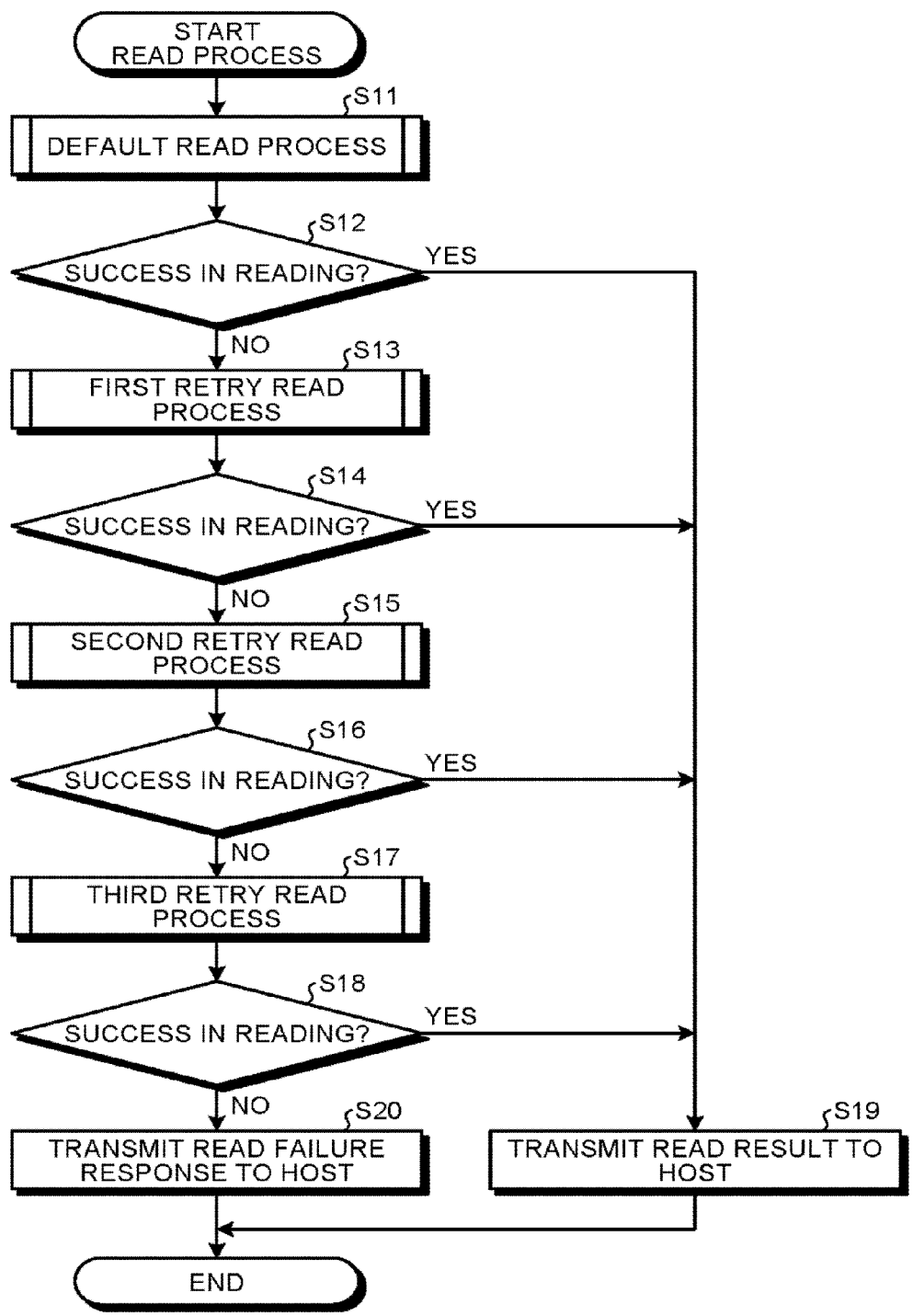
FIG. 8 is a flowchart illustrating an example of read operation according to the first embodiment.
Figure 9:
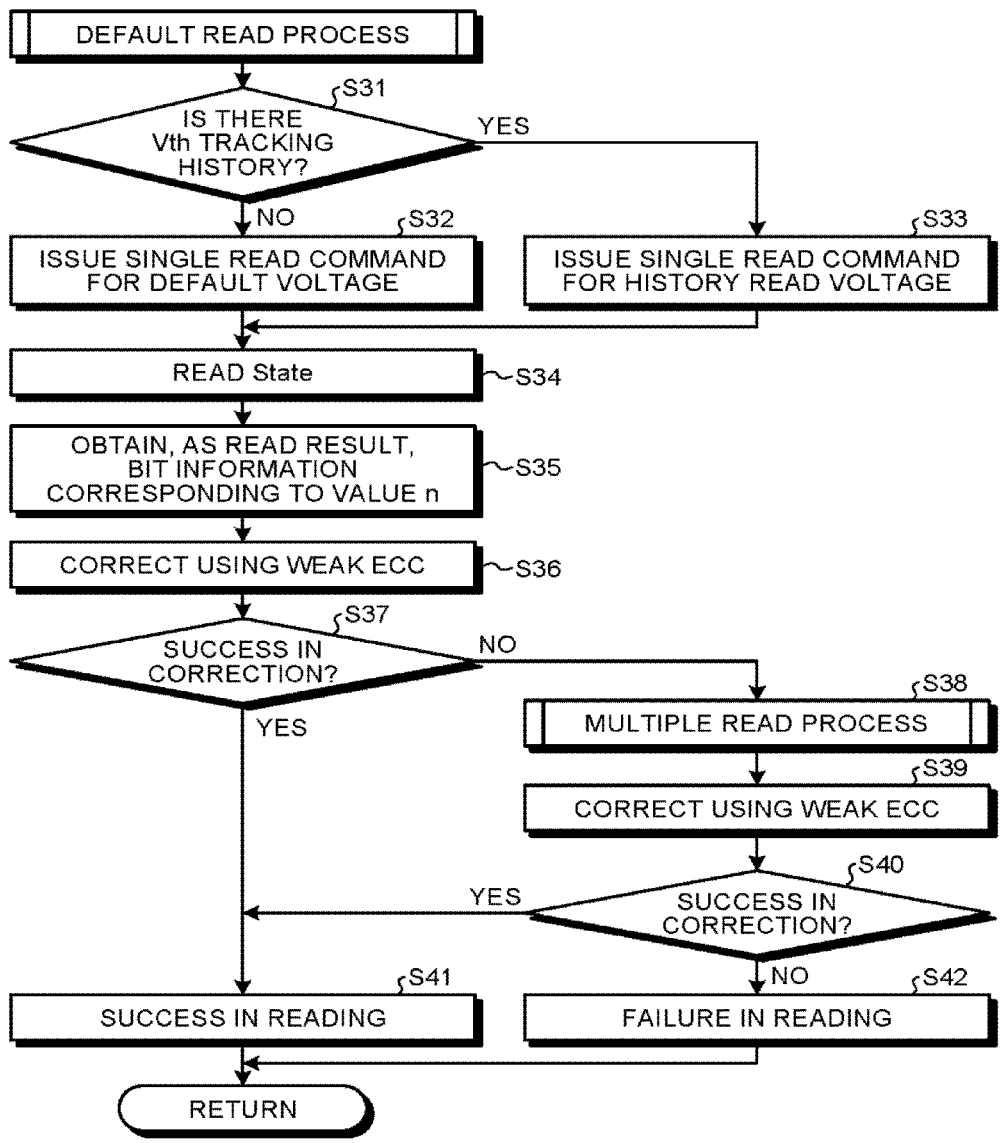
FIG. 9 is a flowchart illustrating an exemplary procedure of a default read process of FIG. 8.
Figure 10:
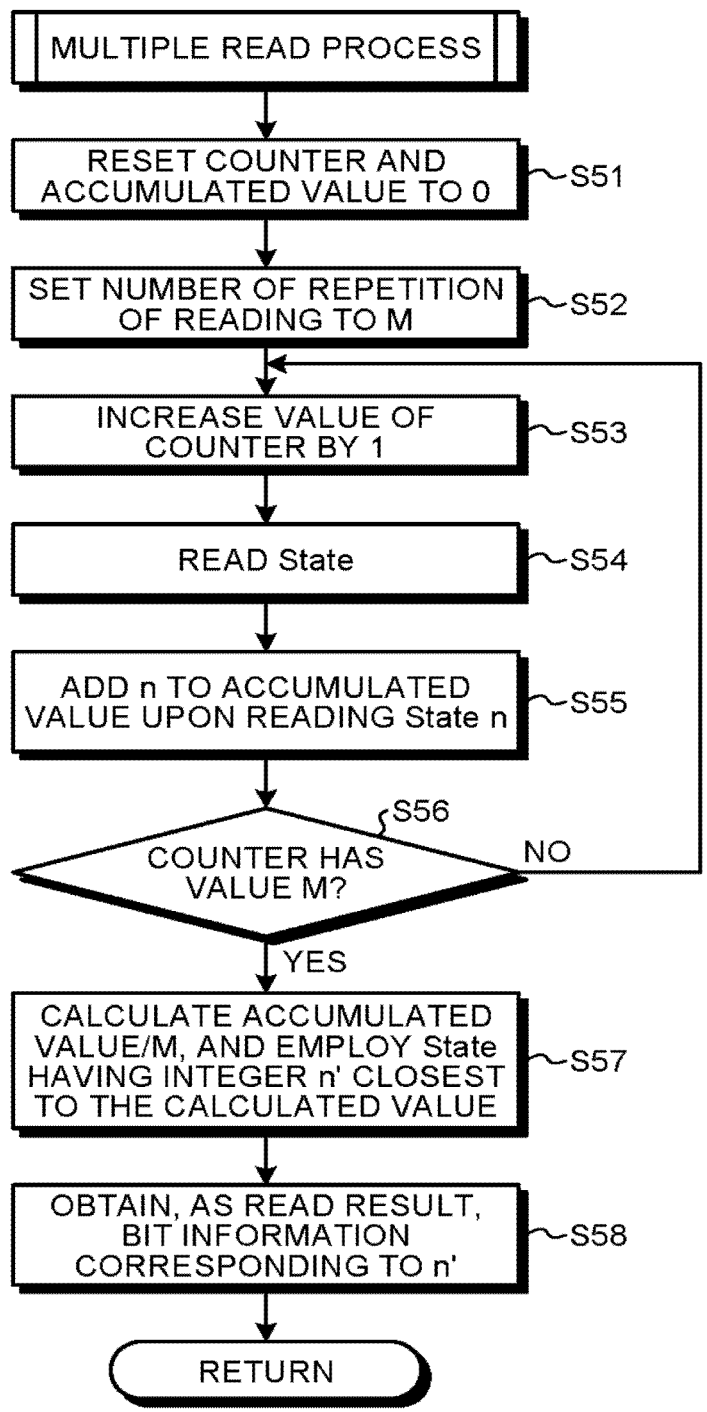
FIG. 10 is a flowchart illustrating an exemplary procedure of a multiple read process.
Figure 11:
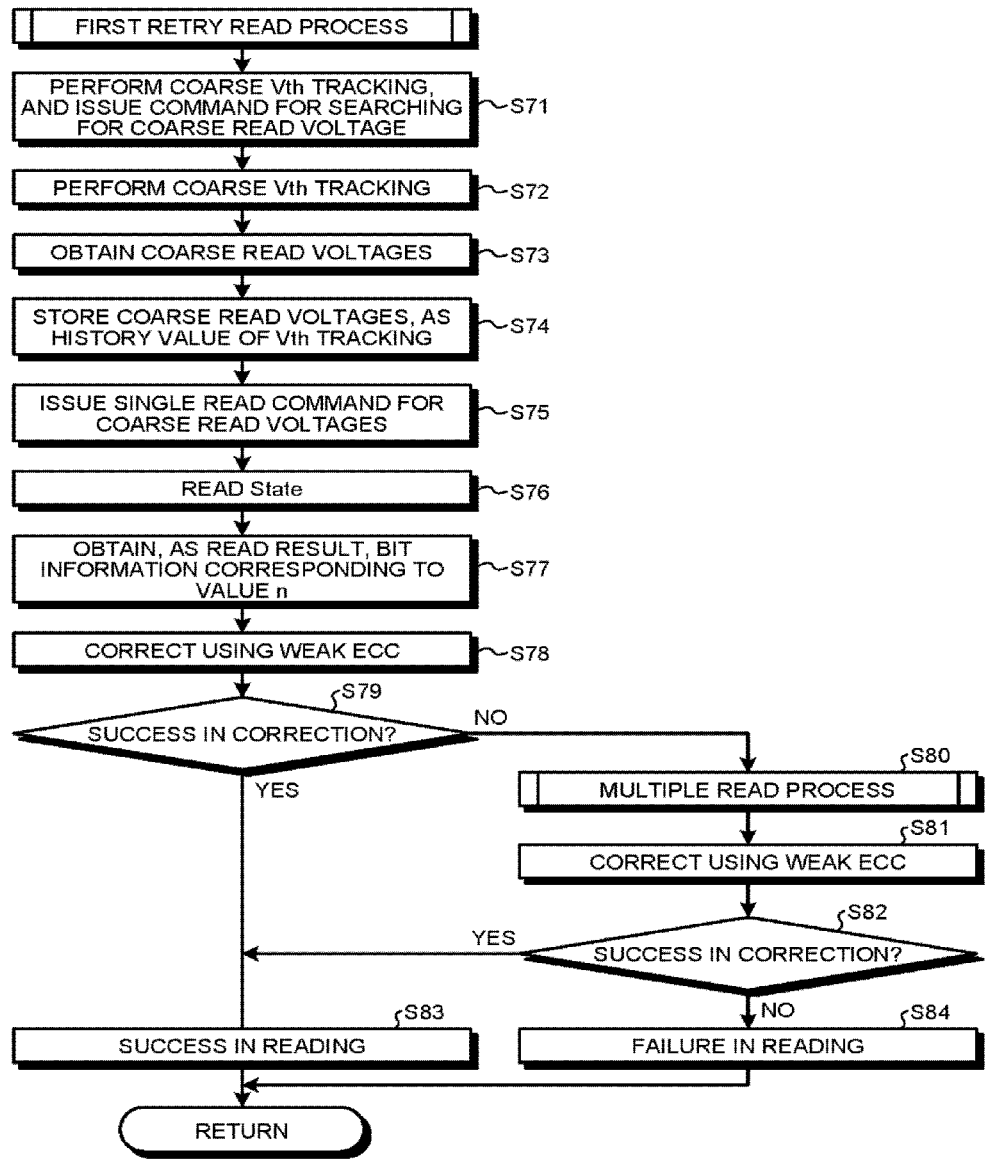
FIG. 11 is a flowchart illustrating an exemplary procedure of a first retry read process of FIG. 8.
Figure 12:
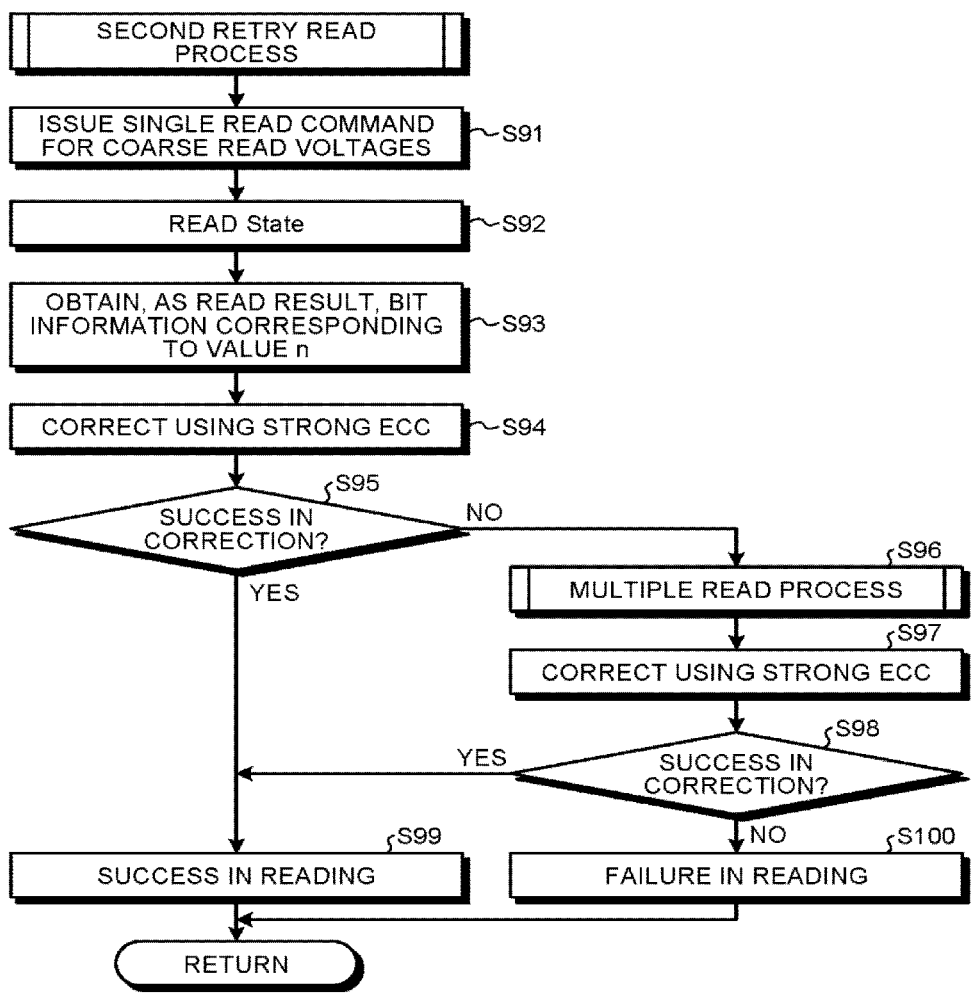
FIG. 12 is a flowchart illustrating an exemplary procedure of a second retry read process of FIG. 8.
Figure 13:
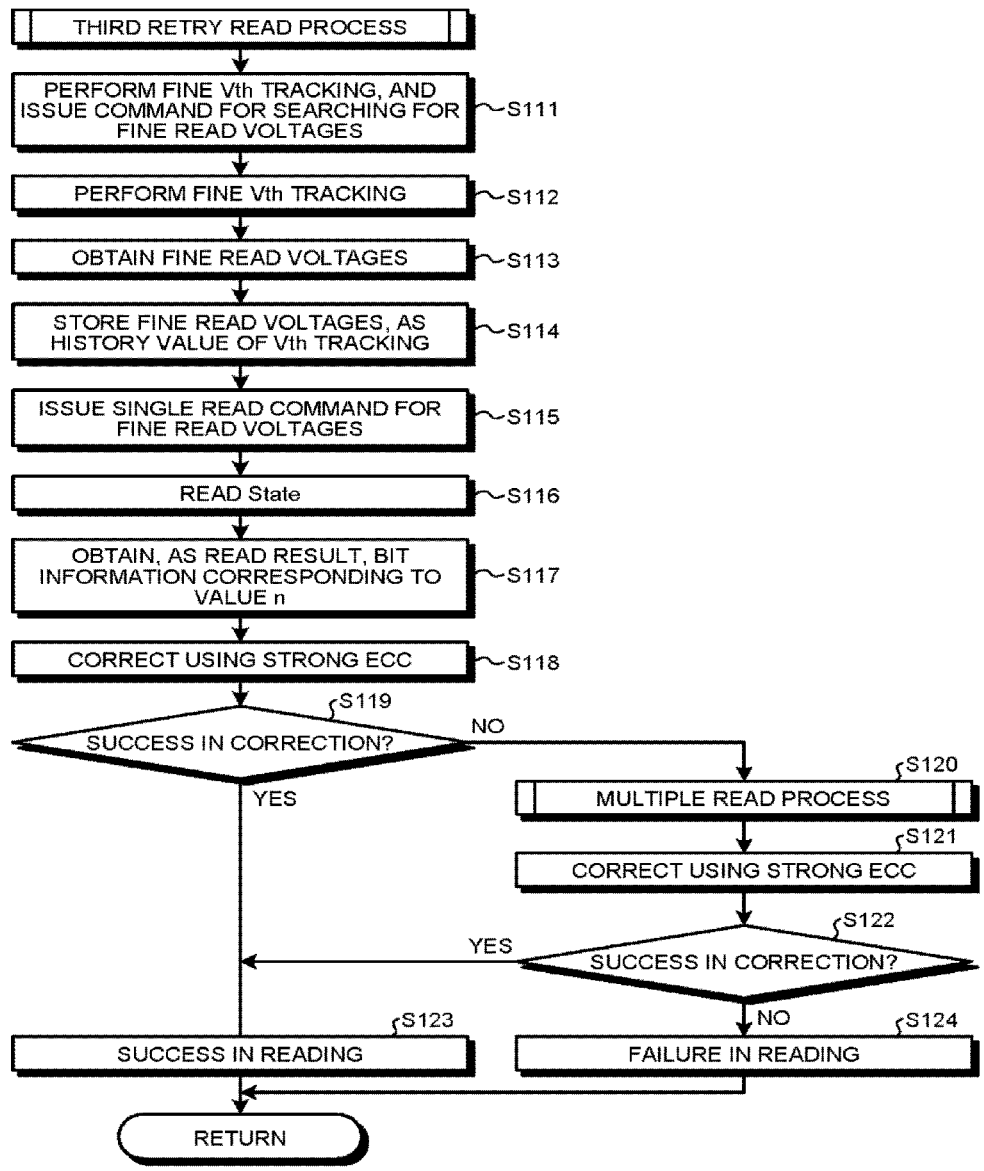
FIG. 13 is a flowchart illustrating an exemplary procedure of a third retry read process of FIG. 8.

Next, a data read process in the memory system 10 having such a configuration will be described. FIG. 8 is a flowchart illustrating an example of the read operation according to the first embodiment, FIG. 9 is a flowchart illustrating an exemplary procedure of the default read process of FIG. 8, FIG. 10 is a flowchart illustrating an exemplary procedure of the multiple read process, FIG. 11 is a flowchart illustrating an exemplary procedure of the first retry read process of FIG. 8, FIG. 12 is a flowchart illustrating an exemplary procedure of the second retry read process of FIG. 8, and FIG. 13 is a flowchart illustrating an exemplary procedure of the third retry read process of FIG. 8.

First, an overview of the read process will be described with reference to FIG. 8. When the memory controller 20 receives a read request from the host 40, the read request is sent to the control unit 23 in the memory controller 20. In the control unit 23, the default read process is performed on corresponding data to the read request (step S11). As a result of the default read process, the read result output unit 234 determines success or failure in reading (step S12).

Upon success in reading (step S12, Yes), the read result is returned to the host 40 through the host I/F 21 (step S19), and the process is terminated. While, upon failure in reading (step S12, No), the control unit 23 performs the first retry read process (step S13). As a result of the first retry read process, the read result output unit 234 determines success or failure in reading (step S14).

Upon success in reading (step S14, Yes), the read result is returned to the host 40 through the host I/F 21 (step S19), and the process is terminated. While, upon failure in reading (step S14, No), the control unit 23 performs the second retry read process (step S15). As a result of the second retry read process, the read result output unit 234 determines success or failure in reading (step S16).

Upon success in reading (step S16, Yes), the read result is returned to the host 40 through the host I/F 21 (step S19), and the process is terminated. While, upon failure in reading (step S16, No), the control unit 23 performs the third retry read process (step S17). As a result of the third retry read process, the read result output unit 234 determines success or failure in reading (step S18).

Upon success in reading (step S18, Yes), the read result is returned to the host 40 through the host I/F 21 (step S19), and the process is terminated. While, upon failure in reading (step S18, No), the control unit 23 returns a read failure response to the host 40 through the host I/F 21, as a result of failure in reading (step S20), and the process is terminated.

Here, the default read process in step S11 will be described with reference to FIG. 9. First, the command issuing unit 231 determines whether there is a Vth tracking history of a memory cell (word line) storing data to be read (step S31). When there is no Vth tracking history (step S31, No), a single read command for a default voltage is issued (step S32). In addition, when there is the Vth tracking history (step S31, Yes), the single read command for a read voltage obtained by a previous Vth tracking and stored is issued (hereinafter, referred to as history read voltage) (step S33). In this process, the command issuing unit 231 issues, to the nonvolatile memory 30, the single read command for the default voltage or the history read voltage as a parameter. Then, the command issuing unit 231 applies the read voltage set in step S32 or S33 to the word line in the NAND memory 30, and reads the state of a target memory cell (step S34). At this time, the weak ECC is also read with the reading of the data.

When the state n is read, the statistical processor 233 obtains, as the read result, the bit information corresponding to the value n (step S35). Then, the decoder 27 corrects the read result using the weak ECC (step S36). The decoder 27 sends a corrected result to the read result output unit 234. The read result output unit 234 determines success or failure in correction by the decoder 27 (step S37). The success in correction (step S37, Yes) leads to success in reading (step S41), and the process returns to FIG. 8. When the decoder 27 is unable to perform the weak ECC on the read result (step S37, No), the command issuing unit 231 performs the multiple read process using the default voltage or the history read voltage (step S38).

The multiple read process will be described with reference to FIG. 10. First, the command issuing unit 231 resets the counter 232 and the accumulated value of the storage unit in the statistical processor 233 to 0 (step S51). Next, the command issuing unit 231 sets the number of repetition of reading to "M" (M is an integer equal to or greater than 2) (step S52), increases the counter 232 by 1 (step S53), performs the read operation of the NAND memory, and reads the state of the NAND memory (step S54). Here, similar to the single read process, when there is the Vth tracking history, the read operation using the history read voltage is performed, and when there is no Vth tracking history, the read operation using the default voltage is performed.

Next, when the read value having the state n is read, the statistical processor 233 adds the value n to the accumulated value (step S55). Then, the statistical processor 233 determines whether the counter 232 has a certain value M (step S56). The certain value M is an integer equal to or greater than 2. When the counter 232 does not have the certain value M (step S56, No), the process returns to step S53, and processing of steps S53 to S55 are repeated until the counter 232 has the certain value M.

When the counter 232 has the certain value M (step S56, Yes), the statistical processor 233 divides an accumulated value $\Sigma n$ by the certain value M, and employs a state having a value of an integer n' selected from integer values 0 to N−1 and closest to the quotient (step S57). Then, the statistical processor 233 outputs, as the read result, the bit information corresponding to the employed state n' (step S58). This is the end of the multiple read process, and the process returns to the flowchart of FIG. 9.

Then, the decoder 27 corrects the result obtained by the multiple read process, using the weak ECC (step S39). The decoder 27 sends a corrected result to the read result output unit 234. The read result output unit 234 determines success or failure in correction by the decoder 27 (step S40). The success in correction (step S40, Yes) leads to success in reading (step S41), and the process returns to FIG. 8. Meanwhile, when the decoder 27 is unable to perform the weak ECC on the result obtained by the multiple read process (step S40, No) leads to failure in reading (step S42), and the process returns to FIG. 8.

Next, the first retry read process in step S13 will be described with reference to FIG. 11. First, the command issuing unit 231 performs the coarse Vth tracking, and issues a command for searching for the read voltage (step S71). Therefore, the memory cell (word line) to be read is subjected to the coarse Vth tracking (step S72). Then, based on a result of the coarse Vth tracking, the coarse read voltages are obtained (step S73), and the coarse read voltages are stored as a history value of the Vth tracking (step S74).

Next, the command issuing unit 231 issues the single read command for the coarse read voltages obtained by the coarse tracking (step S75). In this process, the command issuing unit 231 issues, to the nonvolatile memory 30, the single read command for the coarse read voltage as the parameter. Then, the command issuing unit 231 applies the coarse read voltages to the word line in the NAND memory 30, and reads the state of the target memory cell (step S76). At this time, the weak ECC is also read with the reading of the data.

When the state n is read, the statistical processor 233 obtains, as the read result, the bit information corresponding to the value n (step S77). Then, the decoder 27 corrects the read result using the weak ECC (step S78). The decoder 27 sends a corrected result to the read result output unit 234. The read result output unit 234 determines success or failure in correction by the decoder 27 (step S79). The success in correction (step S79, Yes) leads to success in reading (step S83), and the process returns to FIG. 8. Further, when the decoder 27 is unable to perform the weak ECC on the read result (step S79, No), the command issuing unit 231 performs the multiple read process using the coarse read voltages (step S80). The multiple read process is the same as that illustrated in FIG. 10. However, in this process, the memory cell read process is performed using the coarse read voltages obtained in step S73.

Then, the decoder 27 corrects the result obtained by the multiple read process, using the weak ECC (step S81). The decoder 27 sends a corrected result to the read result output unit 234. The read result output unit 234 determines success or failure in correction by the decoder 27 (step S82). The success in correction (step S82, Yes) leads to success in reading (step S83), and the process returns to FIG. 8. Meanwhile, when the decoder 27 is unable to perform the weak ECC on the result obtained by the multiple read process (step S82, No) leads to failure in reading (step S84), and the process returns to FIG. 8.

Next, the second retry read process in step S15 will be described with reference to FIG. 12. First, the command issuing unit 231 issues the single read command for the coarse read voltages obtained by the coarse tracking (step S91). In this process, the command issuing unit 231 issues, to the nonvolatile memory 30, the single read command for the coarse read voltage as the parameter. Then, the command issuing unit 231 applies the coarse read voltages to the word line in the NAND memory 30, and reads the state of the target memory cell (step S92). At this time, the strong ECC is also read with the reading of the data.

When the state n is read as a result of the reading, the statistical processor 233 obtains, as the read result, the bit information corresponding to the value n (step S93). Then, the decoder 27 corrects the read result using the strong ECC (step S94). The decoder 27 sends a corrected result to the read result output unit 234. The read result output unit 234 determines success or failure in correction by the decoder 27 (step S95). The success in correction (step S95, Yes) leads to success in reading (step S99), and the process returns to FIG. 8. Further, when the decoder 27 is unable to perform the strong ECC on the read result (step S95, No), the command issuing unit 231 performs the multiple read process using the coarse read voltages (step S96). The multiple read process is the same as that illustrated in FIG. 10. However, in this process, the memory cell read process is performed using the coarse read voltages obtained in step S73.

It is noted that after the memory cell read process is performed using the coarse read voltages in step S75 of the first retry read process of FIG. 11, the memory cell read process is performed using the coarse read voltages also in step S92 of the second retry read process. This is because the first retry read process uses the weak ECC, but the second retry read process uses the strong ECC differently from the first retry read process. That is, in addition to a page to be read, another page needs to be read to collect information for error correction to be used. Therefore, also in the second retry read process, the memory cell read process is performed using the coarse read voltages. However, this process can be changed depending on mounting of the strong ECC. For example, when the strong ECC without requiring reading the another page is employed in the second retry read process, data read in step 375 of the first retry read process also includes data for the strong ECC, so that the processing of steps S91 to S96 may not be performed. Accordingly, in this process, the result obtained by the multiple read process is corrected using the strong ECC having been read, in step S97.

Next, the decoder 27 corrects the result obtained by the multiple read process, using the strong ECC (step S97). The decoder 27 sends a corrected result to the read result output unit 234. The read result output unit 234 determines success or failure in correction by the decoder 27 (step S98). The success in correction (step S98, Yes) leads to success in reading (step S99), and the process returns to FIG. 8. Meanwhile, when the decoder 27 is unable to perform the strong ECC on the result obtained by the multiple read process (step S98, No) leads to failure in reading (step S100), and the process returns to FIG. 8.

Next, the third retry read process in step S17 will be described with reference to FIG. 13. First, the command issuing unit 231 performs the fine Vth tracking, and issues a command for searching for the read voltage (step S111). Therefore, the memory cell (word line) to be read is subjected to the fine Vth tracking (step S112). It is noted that the memory cell (word line) to be read includes not only a word line holding target data, but also another word line holding data required for decoding the strong ECC. Then, based on a result of the fine Vth tracking, the read voltages finely searched for are obtained (step S113), and the fine read voltages are stored as a history value of the Vth tracking (step S114).

Next, the command issuing unit 231 issues the single read command for the read voltages finely searched for, obtained by the fine Vth tracking (step S115). In this process, the command issuing unit 231 issues, to the nonvolatile memory 30, the single read command for the fine read voltage as the parameter. Then, the command issuing unit 231 applies the fine read voltages to the word line in the NAND memory, and reads the state of the target memory cell (step S116). At this time, the strong ECC is also read with the reading of the data. It is noted that the memory cell (word line) to be read includes not only a word line holding target data, but also another word line holding data required for decoding the strong ECC.

When the state n is read, the statistical processor 233 obtains, as the read result, the bit information corresponding to the value n (step S117). Then, the decoder 27 corrects the read result using the strong ECC (step S118). The decoder 27 sends a corrected result to the read result output unit 234. The read result output unit 234 determines success or failure in correction by the decoder 27 (step S119). The success in correction (step S119, Yes) leads to success in reading (step S123), and the process returns to FIG. 8. Further, when the decoder 27 is unable to perform the strong ECC on the read result (step S119, No), the command issuing unit 231 performs the multiple read process using the read voltages finely searched for (step S120). The multiple read process is the same as that illustrated in FIG. 10. However, in this process, the memory cell read process is performed using the read voltages finely searched for in step S113.

Next, the decoder 27 corrects the result obtained by the multiple read process, using the strong ECC (step S121). The decoder 27 sends a corrected result to the read result output unit 234. The read result output unit 234 determines success or failure in correction by the decoder 27 (step S122). The success in correction (step S122, Yes) leads to success in reading (step S123), and the process returns to FIG. 8. Meanwhile, when the decoder 27 is unable to perform the strong ECC on the result obtained by the multiple read process (step S122, No) leads to failure in reading (step S124), and the process returns to FIG. 8.

It is noted that, in the above-mentioned example, reading is performed by the single read command in all processes of FIGS. 9, 11, 12, and 13, and upon failure in error correction, the multiple read process is performed. However, the embodiment is not limited to this configuration. The multiple read process is preferably performed in at least one of the processes. In addition, in the above description, the control unit 23 issuing the command to the nonvolatile memory 30 through the memory I/F 22 has been described, but the memory I/F 22 may issue a command to the nonvolatile memory 30.

In the first embodiment, the memory controller 20 issues a normal single read command, and upon failure in reading as a result of reading data, the multiple read process is performed. A certain number of read processes are performed on each memory cell, and the value of the state read in each read process is accumulated for each memory cell. The accumulated value and the number of repetition is used to calculate the average, and the bit information corresponding to the state having the value closest to the calculated average is selected. As described above, the results of the multiple read process is used to read data, and the influence of temporal dispersion of the threshold voltages can be reduced. Therefore, the bit error rate is effectively reduced.

Further, when the read request is received from the host 40, the default read process is performed, and upon failure in reading data, the first retry read process, the second retry read process, and the third retry read process are sequentially performed to read the data. Therefore, a probability of failure in reading data is reduced, or the correct answer rate of reading data is effectively increased.

Second Embodiment

The first embodiment has been described in which the values of the state are accumulated during the multiple read process, and after the certain number of the read processes, the average is obtained from the accumulated value and the value of the state is determined. In a second embodiment, determination of the value of the state by majority will be described.

The memory system according to the second embodiment has a configuration similar to the configuration of the first embodiment. However, the statistical processor 233 has N read value counters for counting the number of generation of the read value, wherein N represents the number of states of the memory cell. Hereinafter, a read value counter corresponding to a state n (n is an integer equal to or greater than 0 and equal to or less than N−1) is selected from the N read value counters, and expressed as a read value counter [n]. When the read value having the state n is read, the statistical processor 233 increases the value of the read value counter [n] associated with the state n by 1. After a certain number of repetition of the above-mentioned procedure, a read value counter [n'] having the largest value is selected is selected from the N read value counters [n], and a corresponding state n' is employed. The bit information corresponding to the state n' is output as the read result. That is, in the second embodiment, the bit information corresponding to the most frequent state (mode) of the plurality of states read in the multiple read process is defined as the read result. It is noted that the other component elements are configured similar to those of the first embodiment, and description thereof will be omitted.

Figure 14:
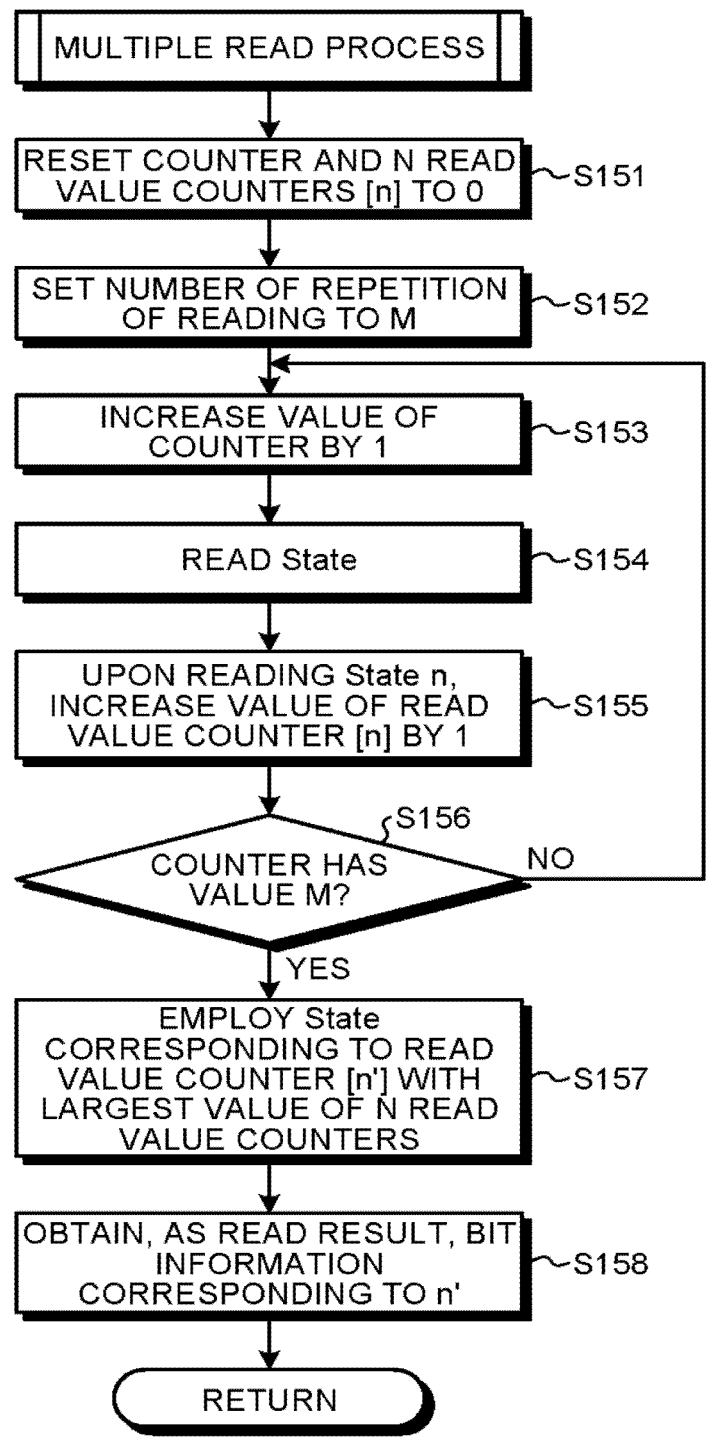
FIG. 14 is a flowchart illustrating an exemplary procedure of a multiple read process according to a second embodiment.

Basically, the method of controlling the nonvolatile memory 30 according to the second embodiment is also configured similar to that of the first embodiment. However, only a procedure in the multiple read process is different from that of the first embodiment, so that the multiple read process will be described below. FIG. 14 is a flowchart illustrating an exemplary procedure of the multiple read process according to the second embodiment.

First, the command issuing unit 231 resets the counter 232, and the N read value counters in the statistical processor 233 to 0 (step S151). Next, the command issuing unit 231 sets the number of repetition of reading to "M (M is an integer equal to or greater than 2)" (step S152), and increases the counter 232 by 1 (step S153). Then, the read operation is performed on the NAND memory 30, or the state thereof is read (step S154). However, in the default read process, when there is the Vth tracking history, the read operation is performed using the history read voltage, and when there is no Vth tracking history, the read operation is performed using the default voltage. Further, in the first and second retry read processes, the memory cell read process is performed using the read voltages coarsely searched for. Further, in the third retry read process, the memory cell read process is performed using the read voltages finely searched for.

Next, when the read value having the state n is read, the statistical processor 233 increases the value of the read value counter [n] by 1 (step S155). Then, the statistical processor 233 determines whether the counter 232 has the certain value M (step S156). When the counter 232 does not have the certain value M (step S156, No), the process returns to step S153, and steps S153 to S155 are repeated until the counter 232 has the certain value M.

When the counter 232 has the certain value M (step S156, Yes), the statistical processor 233 employs the state n' corresponding to a read value counter [n'] with a largest value of the N read value counters (step S157). Then, the statistical processor 233 outputs the bit information corresponding to the employed state as the read result (step S158). This is the end of the multiple read process.

In the above description, the multiple read process repeated a certain number M of times has been described. However, the same read value is obtained a number of times equal to or larger than the number of repetition of reading/2 before the read process reaches the certain value M, the read value may be employed to stop the multiple read. Such a configuration as described above allows interruption of the read process, and a time required for a repetitive read process can be reduced. That is, a quick read process can be provided.

In the second embodiment, the read value counter is provided for each state to count the number of read values having been read, and after the multiple read process, the state corresponding to the read value counter having the largest number is employed as the read value. Such a configuration also provides an effect similar to the first embodiment.

It is noted that, in the first and second embodiments, the data for the multiple read process is not particularly limited, but the data may be stored at the same position or another position. For example, system data stores multiple data sets. Therefore, when the system data is read, each of the multiple data sets may be read. More specifically, when the system data stores duplicated data sets, data set stored at a position may be read a number of times of M/2, and data set having the same content and stored at another position may be read a number of times of M/2.

Here, the system data represents data such as a logical-physical conversion table for management of data storage positions in the NAND memory 30, the number of erasure for each logical block, the number of write/read for each logical block, data retention time, other than the user data. It is noted that the user data represents data stored based on a user write request made from the host 40.

Owing to such a configuration, when data is written, the memory controller 20 determines whether the data is the system data, and when the data is the system data, multiple writing is performed. For example, the NAND memory 30 can be divided into an area for storing the user data, and an area for storing the system data. Therefore, the system data can be determined based on whether a write instruction is made for the area for storing the system data.

Figure 15:
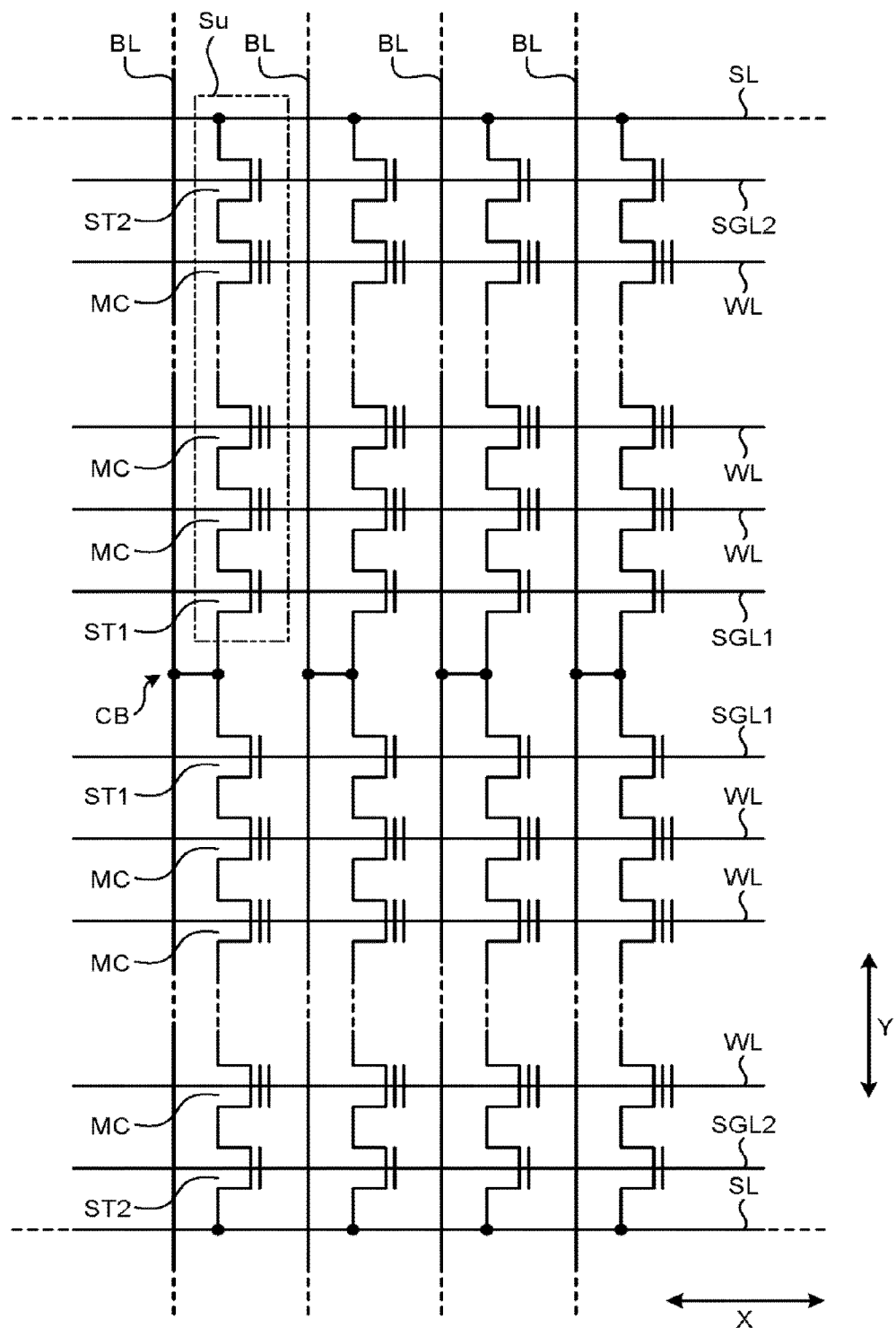
FIG. 15 is an equivalent circuit diagram illustrating part of a memory cell array formed in a memory cell area of the NAND memory.

Further, in the above description, the number of repetition M in the multiple read process is not particularly limited. FIG. 15 is an equivalent circuit diagram illustrating part of a memory cell array formed in a memory cell area of the NAND memory. In the memory cell array of the NAND memory, a NAND cell unit (memory unit) Su includes two selection gate transistors ST1 and ST2, and a memory cell column having a plurality of (e.g., $2^n$ (n is a positive integer)) memory cells MC connected in series between the selection gate transistors ST1 and ST2, and a plurality of the NAND cell units are arranged in a matrix form. In the NAND cell unit Su, the plurality of memory cells MC are formed to have source/drain areas each shared between adjacent memory cells.

The memory cells MC arranged in an X direction (word line direction, corresponding to gate-width direction) in FIG. 15 are commonly connected by the word line (control gate line) WL. Further, the selection gate transistors ST1 and the selection gate transistors ST2 are arranged in the X direction in FIG. 15, respectively. The selection gate transistors ST1 are commonly connected by a selection gate line SGL1, and the selection gate transistors ST2 are commonly connected by a selection gate line SGL2. The selection gate transistor ST1 has a drain area connected with a bit line contact CB. The bit line contact CB has one end connected to the bit line BL extending in a Y direction (bit line direction, corresponding to gate-length direction) perpendicular to the X direction in FIG. 15. Further, the selection gate transistor ST2 is connected through the source area to a source line SL extending in the X direction in FIG. 15.

Generally, in the NAND memory having such a configuration, the memory cells MC positioned at both ends of the NAND cell unit Su, or the memory cells MC connected to the word lines WL adjacent to the selection gate lines SGL1 and SGL2 have a threshold voltage which tends to change. Therefore, when the multiple read process is performed on the memory cells MC connected to the word lines WL adjacent to the selection gate lines SGL1 and SGL2, the number of reading M may be increased compared with the number of reading of the memory cells MC connected to the other word lines WL. Such a configuration as described above can reduce the bit error rate of the memory cells MC connected to the word lines WL adjacent to the selection gate lines SGL1 and SGL2.

Further, in the above description, the description has been made of the command issuing unit 231, the counter 232, the statistical processor 233, and the read result output unit 234 which are provided in the control unit 23, but all or part of them may be provided in the memory I/F 22. Still further, the counter 232, the statistical processor 233, and the read result output unit 234 may include hardware, or may be executed as firmware in the control unit 23.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a memory cell configured to store two or more bit data; and
a controller circuit configured to receive a read request from a host, and perform processing according to the read request, wherein
the controller circuit includes:
a command issuing circuit configured to issue a first command for single read of first data from the nonvolatile memory,
a decoder configured to perform first error correction on the read first data,
a counter configured to count a number of times of multiple reads, and
a statistical processor configured to perform statistical processing of results of the multiple reads, and output second data obtained by the statistical processing,
the command issuing circuit issuing a second command for multiple reads of the first data, each read of the multiple reads using an identical read voltage, when the decoder detects an uncorrectable error in the first error correction on the read first data.

2. The memory system according to claim 1, wherein the statistical processor converts the results of the multiple reads to values respectively, calculates an average of the values, and outputs data corresponding to the calculated average as the second data.

3. The memory system according to claim 1, wherein the statistical processor converts the results of the multiple reads to values respectively, calculates a mode of the values, and outputs data corresponding to the calculated value as the second data.

4. The memory system according to claim 3, wherein
the command issuing circuit further sets a number of times of the multiple reads, and
the statistical processor calculates the value for each of the multiple reads, counts an appearance frequency of the calculated values for each of the multiple reads, and stops the multiple reads when the counted appearance frequency becomes equal to or larger than ½ of the set number.

5. The memory system according to claim 1, wherein the decoder performs the first error correction on the second data.

6. The memory system according to claim 5, wherein when the decoder detects an uncorrectable error in the first error correction on the second data, the command issuing circuit issues a third command searching for a first read voltage.

7. The memory system according to claim 6, wherein the command issuing circuit issues a fourth command for single read of the first data using the searched first read voltage.

8. The memory system according to claim 7, wherein the decoder performs the first error correction on the read first data corresponding to the fourth command.

9. The memory system according to claim 8, wherein when the decoder detects an uncorrectable error in the first error correction on the read first data corresponding to the fourth command,
the command issuing circuit issues a fifth command for multiple reads of the first data using the searched first read voltage,
the statistical processor performs statistical processing of results of the multiple read corresponding to the fifth command, and outputs third data obtained by the statistical processing, and
the decoder further performs the first error correction on the third data.

10. The memory system according to claim 9, wherein when the decoder detects an uncorrectable error in the first error correction on the third data,
the command issuing circuit issues a sixth command for single read of the first data using the first read voltage, and
the decoder performs second error correction on the read first data corresponding to the sixth command, the second error correction having a capability higher than the capability of the first error correction.

11. The memory system according to claim 10, wherein when the decoder detects an uncorrectable error in the second error correction on the read first data corresponding to the sixth command,
the command issuing circuit issues a seventh command searching for a second read voltage, and issues an eighth command for single read of the first data using the searched second read voltage, and
the decoder performs the second error correction on the read first data corresponding to the eighth command.

12. The memory system according to claim 11, wherein
search for the first read voltage and the second read voltage includes obtaining a distribution of threshold voltages of the memory cell obtained by changing the read voltage by a certain magnitude, and searching for the read voltage based on the obtained distribution of the threshold voltages, and
the certain magnitude in the search for the second read voltage is smaller than the certain magnitude in the search for the first read voltage.

13. The memory system according to claim 1, wherein the nonvolatile memory is a NAND type flash memory.

14. A memory system comprising:
a nonvolatile memory configured to store data; and
a controller circuit including a command issuing circuit configured to issue a command to the nonvolatile memory, the command issuing circuit issuing a first command for searching a first read voltage, by changing a read voltage by a first step, to read data from the nonvolatile memory, and the command issuing circuit issuing a second command for searching a second read voltage, by changing a read voltage by a second step, to read data from the nonvolatile memory,
the second step being smaller than the first step.

15. The memory system according to claim 14, wherein
the controller circuit further includes a decoder configured to perform an error correction on data read from the nonvolatile memory, and
the command issuing circuit issues the second command when the decoder detects, with a first error correction code, an uncorrectable error in first data read from the nonvolatile memory by using the first read voltage.

16. The memory system according to claim 15, wherein the decoder performs an error correction, with a second error correction code, on the first data read from the nonvolatile memory by using the second read voltage.

17. The memory system according to claim 16, wherein the error correction capability with the second error correction code is equal to or higher than the error correction capability with the first error correction code.

18. A memory system comprising:
a nonvolatile memory configured to store data; and
a controller circuit including a command issuing circuit configured to issue a command to the nonvolatile memory and a decoder configured to perform an error correction on data read from the nonvolatile memory,
the command issuing circuit issuing a first command for reading first data from the nonvolatile memory by using a first read voltage, upon the decoder detecting, with a first error correction code, an uncorrectable error in the first data, the command issuing circuit issuing a second command for searching a second read voltage, by changing a read voltage by a first step, to read data from the nonvolatile memory.

19. The memory system according to claim 18, wherein the decoder performs an error correcting, with a second error correction code, on the first data read from the nonvolatile memory by using the second read voltage.

20. The memory system according to claim 19, wherein the error correction capability with the second error correction code is equal to or higher than the error correction capability with the first error correction code.

* * * * *